United States Patent [19]
Vaitkus

[11] 4,353,059
[45] Oct. 5, 1982

[54] MULTITHRESHOLD CONVERTER UTILIZING REFERENCE TRACKING AMPLIFIERS

[75] Inventor: Rimantas L. Vaitkus, Phoenix, Ariz.
[73] Assignee: Motorola Inc., Schaumburg, Ill.
[21] Appl. No.: 150,538
[22] Filed: May 16, 1980
[51] Int. Cl.³ .......................................... H03K 13/175
[52] U.S. Cl. ......................... 340/347 AD; 340/347 M
[58] Field of Search .................. 340/347 M, 347 AD; 328/146; 375/30

[56] References Cited
U.S. PATENT DOCUMENTS
3,688,221 8/1972 Fruhalf ................. 340/347 AD UX
3,860,952 1/1975 Tallent et al. .................. 360/360 X
4,083,043 4/1978 Breuer .......................... 340/347 AD Primary Examiner—Thomas J. Sloyan
Attorney, Agent, or Firm—Eugene A. Parsons

[57] ABSTRACT

A multithreshold A/D converter has primary and secondary quantizing stages. The threshold reference voltages for the secondary quantizing stages are obtained by amplifying a threshold reference voltage step derived from the primary quantizing stage. Since the secondary threshold reference voltages are derived directly from the primary reference voltages the secondary reference voltages will track deviations occurring within the primary quantizing stage. A reference tracking amplifier is utilized to amplify a portion of the primary reference voltage and apply same to the secondary stage. By using monolithic integrated circuit fabrication techniques to identically match the reference tracking amplifier with the error amplifiers of the primary quantizing stages, the secondary threshold reference voltages will also track deviations in the peak error signals conveyed from the primary to the secondary quantizing stages.

1 Claim, 10 Drawing Figures

MULTITHRESHOLD CONVERTER UTILIZING REFERENCE TRACKING AMPLIFIERS

BACKGROUND

1. Field of the Invention

The invention relates to the field of multithreshold analog to digital (A/D) converters. In particular the invention relates to a regenerative comparator providing a clocked differential output which may be utilized efficiently in such converters.

The invention particularly relates to A/D converters of two or more sections wherein a multiplicity of error amplifiers are interspersed throughout a first section thereof, one of said error amplifiers selectably providing a differential signal for quantizing and encoding in the one or more remaining sections of the converter.

The invention further relates to such a two or more section converter wherein means are provided to permit the second and more sections to track variations in both DC quantizing reference levels as well as the peak amplitude of the error signal provided to said second or more sections.

The invention may be particularly related to a multithreshold A/D converter having an absolute value device at its input to provide a signal which is always of one polarity whereby the number of threshold devices within said converter may be reduced by fifty percent for a given number of bits output by said converter.

2. Prior Art

The multithreshold A/D converter has been described as ". . . by far the most straightforward and the fastest A/D converter of all." (Hermann Schmid, Electronic Analog/Digital Conversions, Van Nostrand Reinhold Company, New York, page 296.) Schmid points out that the multithreshold A/D converter operates almost instantaneously, being limited only by the delays of one comparator and a few logic gates. He notes that the total conversion time is less than 100 nsec when using conventional comparators and ordinary TTL logic gates. The primary disadvantage noted is that the multithreshold converter requires one comparator for each threshold level, except for zero. Thus in an n-bit converter there will be $2^n-1$ comparators. It would thus be advantageous to provide a multithreshold A/D converter which would require significantly less than $2^n-1$ threshold levels for an n-bit converter.

It may be noted here that conventional comparators may provide an undecisive, ambiguous output when the voltage levels being compared are extremely close in magnitude. It would thus be desirable to provide a comparator capable of absolutely differentiating extremely close voltage levels within an extremely small period of time.

The multithreshold A/D converter is frequently referred to as a parallel-cascaded A/D converter. The analog signal to be converted is applied to a parallel network of threshold comparators. The thresholds are normally established by comparison with a set of regularly graduated reference voltages derived from a multiplicity of points along a resistive ladder network. The bit obtained at the output of the converter is a logical "1" or a logical "0" depending upon whether or not the analog input signal voltage is greater than the threshold voltage point along the resistive ladder to which it is compared.

Typically, two sets of threshold comparisons are provided within the converter. The first set provides the most significant bits, MSBs, while the second provides the least significant bits, LSBs. Obviously, the second section encodes that portion of the analog input signal voltage not acounted for by the first section of the converter. Thus, the comparisons performed within the second section must be performed with respect to what remains of the input signal voltage when the voltage accounted for by the MSBs have been subtracted therefrom. Therefore the input signal must be provided to the second comparison section in a manner which subtracts that portion of the input signal which has already been encoded as a result of threshold comparison within the first section.

Linear amplifiers are typically used to interconnect the two threshold comparison sections. Such use of linear amplifiers in prior art devices has led to restriction in the speed of operation of the converter. Further, because of the susceptibility of such linear amplifiers to variations in temperature and other operating conditions, reduced reliability and accuracy in converter operation was experienced.

Variations in temperature and operating conditions have been known to adversely affect the resistive ladder networks used for deriving the various reference threshold levels. It would thus be advantageous to provide an A/D converter in which variations in both reference ladder networks and peak error amplitude signals output by linear amplifying devices were made to track in a manner so as to increase reliability and accuracy of operation.

It is therefore an objective of the present invention to provide a multithreshold A/D converter having a reduced number of thresholds for any given number of bits output by said converter thereby significantly reducing the number of devices, for example, comparators, required within the converter.

It is a further objective of the invention to provide a new and improved comparator which may be used in such multithreshold A/D converters, which comparators are capable of absolute differentiation of minute differences in voltage levels when provided sufficient time to achieve such absolute differentiation, and which can typically differentiate voltage differences of 10 nv within a time span of 10 to 50 nsec using current bipolar technology.

It is an additional objective of the invention to provide the means whereby drift in ladder threshold reference levels and in peak error signal amplitudes may be tracked so as to provide more reliable and accurate A/D conversion.

SUMMARY OF THE INVENTION

In one of its preferred embodiments the A/D converter has the input signal passed through an absolute value device prior to threshold comparison. The absolute value devices provides a signal which is always of one polarity, being folded about a selected voltage threshold point as it passes through said absolute value device. A sign bit determination is made to identify the signal being compared as having been originally nominally above or below the selected threshold point about which the input signal is folded. The effect of folding the input signal so as to provide only one polarity of signal to the threshold comparators is to reduce by fifty percent the number of comparison threshold levels required for a given number of bits output by the converter.

In a second preferred embodiment of the invention the conventional comparators well known in the prior art are replaced by instantaneously reacting comparators comprised of a clocked, replica amplifier and a clocked, regenerative logic level generator providing absolute differentiation of input analog signals and threshold reference levels. These regenerative comparators, described in detail later herein, accept the input signal at a D input, and the threshold reference signal at a $\overline{D}$ input. Unlike the conventional op-amp comparator which may sit interminably and indecisively when the input signal is close to the DC reference threshold, the regenerative comparator is capable of resolving extremely close voltage level differences if given sufficient time to do so and will typically differentiate voltage differences of 10 nv within 10 to 50 nsec. The use of such comparators need not be limited to utilization in A/D converters.

In a third embodiment of the invention all linear devices are matched by utilizing monolithic techniques to make all such devices identical. Because of this identity, these devices will track each other under varying conditions of operation and temperature. Further by deriving the threshold reference voltage for a second threshold comparison bank from a voltage step from a bit in the threshold reference ladder of the preceding threshold comparison section and passing it through one of said identical linear devices, the error reference voltage utilized in the second comparator bank will tend to track the peak voltage drift of the primary reference ladder as well as tracking the peak amplitude of the error signal provided to the secondary comparison stage.

To reduce the dynamic range requirements (often 1000 to 1) imposed upon prior art linear devices used to link the input signal from the MSB comparison stage to the LSB comparison stage, a preferred embodiment of the invention substitutes a multiplicity of error amplifiers for the single, broad dynamic range amplifier taught in the prior art. Each such amplifier has a differential input and is connected at a threshold level midway between adjacent comparators. Thus, when one comparator indicates the incoming signal is higher than the threshold, while an adjacent comparator indicates that the incoming signal is lower than threshold, the error amplifier connected intermediate thereof need only provide a differential signal indicative of whether the incoming signal is higher or lower than the threshold reference at the position at which the subject amplifier is connected to the reference ladder. The requirement for dynamic range of such an intermediate amplifier is drastically reduced from that of the single amplifier of the prior art in that the maximum voltage difference presented at the inputs of such an intermediate amplifier will be only that voltage difference which exists between the threshold immediately above and below the point at which such intermediate amplifier is tied in to the reference ladder. By making all such intermediate amplifiers identical through the application of monolithic fabrication techniques, no discernable error is introduced as the error signal fed to the secondary comparison stage is selectably and variably derived from individual ones of said intermediate amplifiers. The choice of which amplifier is selected is determined by logic devices driven by said adjacent comparators. Since the signal is always present at the input to said intermediate error amplifiers there is no need for the relatively long delays experienced in prior art devices in which it is necessary to wait until the MSB has been decided and time for settling allowed before transmitting the LSB portion of the input signal to the second stage of threshold comparison and encoding.

DETAILED DESCRIPTION OF THE INVENTION

Prior Art Multithreshold A/D Converter

Figure 1:
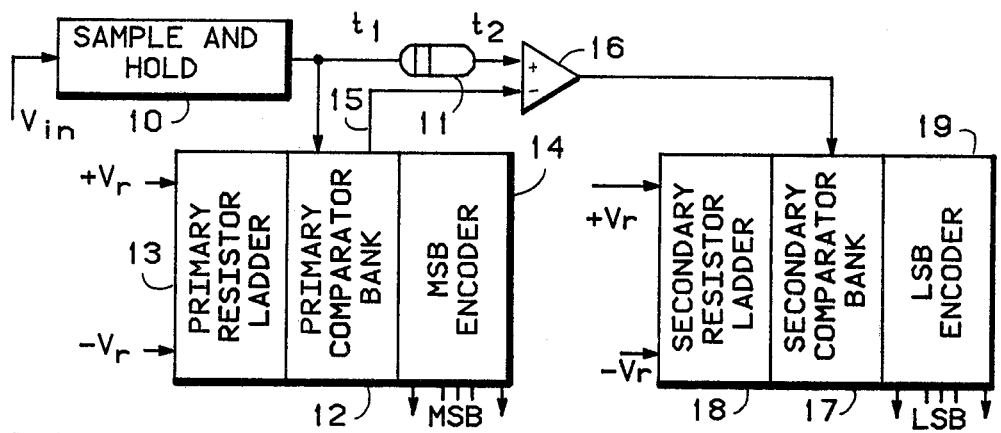
FIG. 1 is a block diagram of a prior art multi-threshold A/D converter indicating the two parallel comparison stages connected in cascade.

A multithreshold A/D converter, well known in the prior art, is presented in block diagram format in FIG. 1. The signal to be quantized and encoded, Vin, is passed through sample and hold circuit 10. the output of sample and hold 10 is connected to time delay 11 and to primary comparator bank 12. As is well known, primary comparator bank 12 is comprised of a plurality of comparators having differential input ports. The input signal Vin is connected to a selected one of the input ports, say, for example, the non-inverting input port, of each one of said plurality of comparators.

Primary resistor ladder 13 is a resistor divider network spanning reference voltage levels $+Vr$ and $-Vr$. A sufficient number of resistors is provided in primary resistor ladder 13 to provide $2^n-1$ threshold voltage levels for comparison in primary comparator bank 12. In a multithreshold A/D converter "n" represents the number of bits to be converted. Since one comparator is required for each comparison level, except zero, prior art requires that there be $2^n-1$ comparators within primary comparator bank 12. Thus, to provide a five bit comparator will require thirty-one comparators within primary comparator bank 12, in accordance with the teachings of the prior art.

A selected one of the input ports, say, for example, the inverting port, of each comparator is connected to a selected one of the threshold voltage levels provided by primary resistor ladder 13. It is thus that each comparator within primary comparator bank 12 compares the level of the incoming signal Vin with the threshold reference level at which any given comparator is coupled to primary resistor ladder 13.

The outputs of all comparators within primary comparator bank 12 are coupled to the converter logic of MSB encoder 14 which provides a digital encoded output. Encoder 14 is designated an MSB encoder because one or more secondary comparator banks may be provided to further quantize the input signal Vin.

In order to provide the proper secondary quantizing of the input signal, the signal fed to the secondary comparator bank must represent the analog input signal Vin, less the threshold reference voltage determined by the primary bank of comparators. To accomplish this subtraction, primary comparator bank 12 provides an analog signal equivalent to the threshold level determined by the primary comparison determination made within primary comparator bank 12. This analog equivalent signal is fed via line 15 to the inverting port of differential amplifier 16. The input signal Vin traversing sample and hold device 10 and time delay 11 is presented at the non-inverting port of differential amplifier 16 essentially simultaneously with the presentation of the analog equivalent signal at the inverting port thereof. Thus, a differential signal output of amplifier 16 is presented to secondary comparator bank 17 which, in cooperation with secondary resistor ladder 18, provides comparison threshold levels to LSB encoder 19 wherein are derived digitally encoded outputs representative of said differential signal from amplifier 16.

The design and operation of multithreshold A/D converters as just described is well known in the prior art and is presented here to refresh the reader's recollection of the environment to which the innovative teachings presented herein apply.

Conventional Prior Art Comparators

Figure 2:
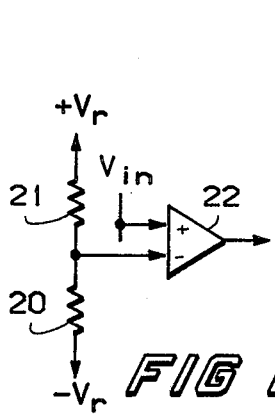
FIG. 2 illustrates a prior art, conventional, op-amp comparator.

FIG. 2 is a block diagram representation of a comparator 22 well known in the prior art. Resistors 20 and 21 represent two of a plurality of resistors which comprise a resistive ladder network, such as 13 or 18 of FIG. 1, which provides a plurality of threshold levels between the limits of $+Vr$ and $-Vr$. Comparator 22 is provided with differential input ports. The threshold reference level established at the junction of resistors 20 and 21 is coupled to the inverting port of comparator 22. The signal Vin to be compared with that threshold reference voltage is coupled to the non-inverting port of comparator 22. Typically the output of comparator 22 will be a digital "0" (low level output voltage) when Vin is less than the selected threshold reference voltage, and a digital "1" (high level output voltage) when Vin exceeds the threshold reference voltage. The transition from one digital level to another occurs over a very narrow voltage range at the value established by the threshold reference voltage.

Comparators such as 22 are well known to the prior art and are discussed here as typical of the comparators conventionally used in prior art A/D converters. While such comparators are capable of providing a rapid transition between high and low level output voltages they are also known to be indecisive at times when the difference between Vin and the threshold reference voltage are very close. In such close situations prior art comparators such as 22 are known to be incapable of providing absolute voltage differentiation regardless of the time provided to achieve differentiation of the two input signals.

The Innovative Comparator of the Invention

To overcome the disadvantages of the prior art comparator, the invention herein disclosed provides an input stage which outputs an amplified replica of the analog input signal and the voltage reference threshold signal. Upon a change of state of the clock signal a logic level generator stage acts regeneratively to raise these output signal replicas to full logic operating levels. Since the signal replica, a differential signal, is already present at the output, the regenerative logic level generator reacts at the instant the clock changes state, typically reacting within 1 ns or less.

Figure 3:
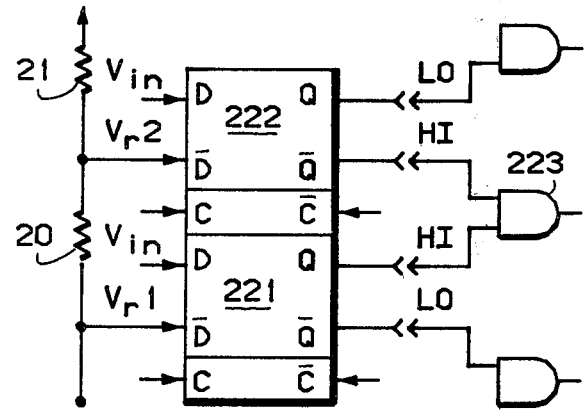
FIG. 3 is a block diagram illustrating the regenerative comparator which has clocked differential outputs. Also illustrated are the logic gates used with the comparators to derive logic output signals which will later be encoded as digital representations of the input analog signal.

The comparator is illustrated in block diagram format in FIG. 3. Two comparators 221 and 222 are illustrated. If the analog input signal Vin is higher than reference threshold Vr1, but lower than threshold reference level Vr2, the logic level outputs shall be as indicated on the $Q/\overline{Q}$ output lines of FIG. 3.

Note the use of logic gate 223 connected to the Q output of comparator 221 and the $\overline{Q}$ output of comparator 222. The output of AND gate 223 will be at a high logic level under the stated, illustrated circumstance. Note further that other, similarly situated logic gates above and below AND gate 223 will all output a low level signal since at least one of their inputs will always be at a low logic level state. Thus the high logic level output of a logic gate such as 223 is indicative of the threshold level at which the analog input signal most closely approaches that of the reference signal.

Comparator Bank with Interspersed Error Amplifiers

Figure 4:
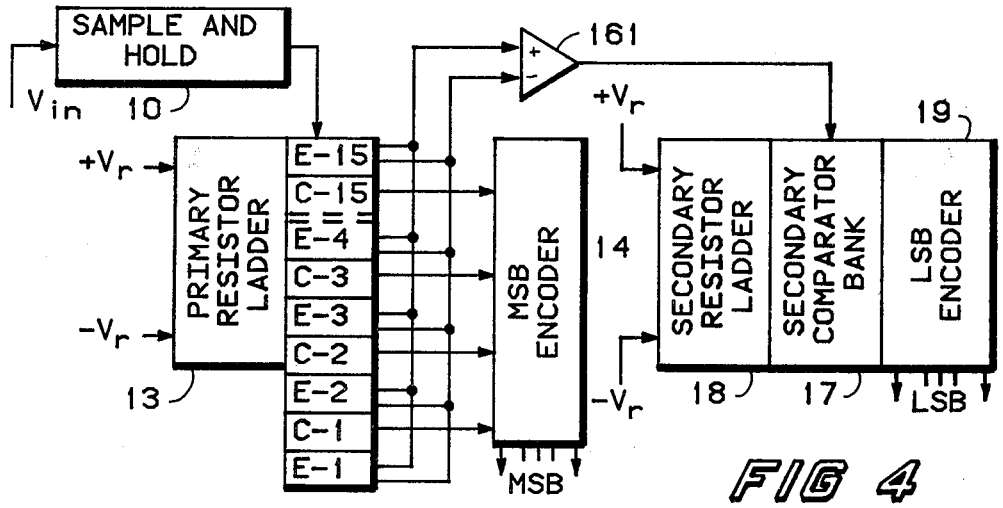
FIG. 4 shows a multithreshold A/D converter and conceptually illustrates the invention's teachings of a multiplicity of relatively narrow range differential amplifiers interspersed between comparators.

A multithreshold A/D comparator reminiscent of that of prior art comparator 12 of FIG. 1 is illustrated in FIG. 4. Like-components in each FIGURE are provided with like-reference numbers. The comparator bank 12 of FIG. 1 however has been modified in FIG. 4 in accordance with the teachings herein. Instead of a comparator bank consisting solely of $2^n-1$ comparators, for example, C-1 through C-15, a quantity of $2^n$ error amplifiers, for example, E-1 through E-16, are interspersed among comparators C-1 through C-15.

Figure 8:
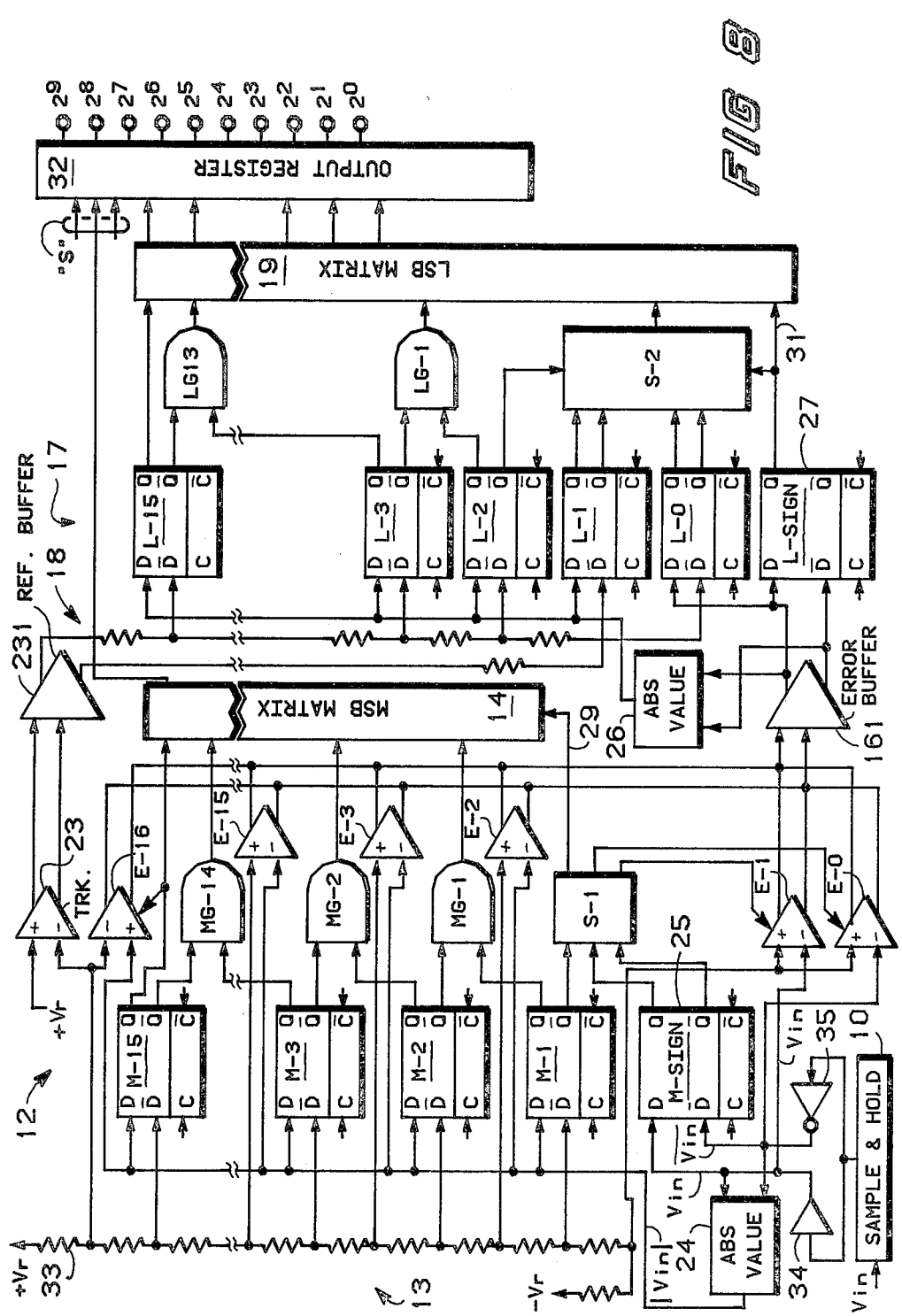
FIG. 8 is a schematic block diagram of a complete multithreshold A/D converter utilizing all of the improvements disclosed in FIGS. 3 through 7.

Error amplifiers E-1 through E-16 are dual input differential amplifiers each of which has one input port connected in parallel to the incoming signal Vin. The remaining port of any given error amplifier is coupled to a threshold point on primary resistor ladder 13, which threshold point lies intermediate the threshold points at which adjacent comparators are coupled. Outermost error amplifiers, for example, E-1 and E-16, are connected to primary resistor ladder 13 one threshold level removed from comparators C-1 and C-15 respectively. This arrangement will be disclosed in greater detail when the drawing of FIG. 8 is discussed.

Error amplifiers E-1 through E-16 are utilized to derive the differential voltage to be quantized in the secondary comparison stages of the converter. Assume that the output of comparators C-1 through C-15 indicates that Vin lies at a threshold level somewhere between the comparison levels indicated by the outputs of comparator C-2 and C-3. Error amplifier E-3, whose inputs lie intermediate these two threshold levels, will output two voltages whose differential range will be less than the difference of the reference threshold levels compared in comparators C-2 and C-3. The output of error amplifier E-3 is fed to differential buffer amplifier 161.

The dynamic range of error amplifier E-3, in this instance, need only be sufficient to adequately differentiate a voltage range defined by the threshold levels across the end points of two adjacent resistors in primary resistor ladder 13. This represents a significant decrease in the dynamic range requirement of differential amplifier 16 used in the prior art converter of FIG. 1, which differential amplifier 16 may be expected to handle differential input voltage ratios of 1000 to 1.

The improved embodiment of FIG. 4 is made possible and practicable by monolithic, integrated circuit technology which will permit the fabrication of error amplifiers E-1 through E-16 and differential buffer amplifier 161 to be identically matched under all conditions of operation and temperature to assure reliable and accurate determination of the differential voltage to be quantized and encoded in the secondary comparator stages.

In actual operation, one of the array of matched error amplifiers E-1 through E-16 will be selected to output differential voltages to differential buffer amplifier 161 based on the decision of adjacent comparators. When the analog input signal Vin lies between thresholds of two adjacent comparators, the signal from the respective error amplifier, for example, E-3, is routed to output differential buffer amplifier 161. Differential buffer amplifier 161 will reject any common mode signal and provide a linear signal to the secondary stages of the A/D converter. As will be shown in greater detail later when FIG. 8 is discussed, all error amplifier signals other than that output by E-3 are coupled to ground at this time.

The suggested embodiment of FIG. 4, with error amplifiers interspersed among the comparators, offers very fast operation since the error signal is generated at the same instant that the comparator operates. When the comparator decision is made, the error signal is ready for the next quantization action.

Error Signal Voltage and Threshold Level Voltage Tracking

Figure 5:
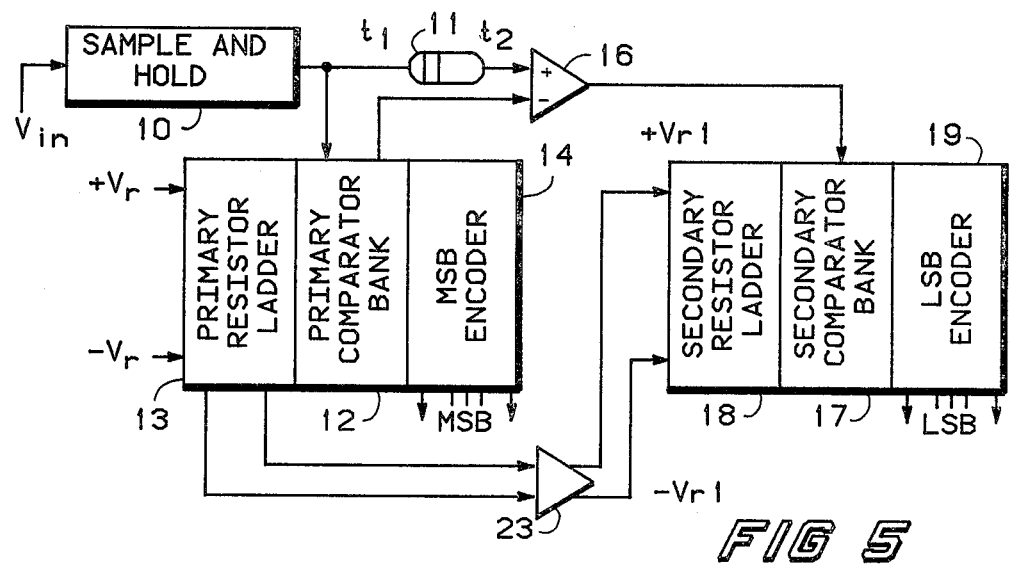
FIG. 5 illustrates an embodiment of the invention wherein the reference voltage applied to the secondary resistive ladder is derived from the primary resistor ladder and amplified by an amplifier identical with the amplifiers linking the primary comparison stages to the secondary comparison stages of the converter.

FIG. 5 discloses an alternate embodiment to improve the performance of the multithreshold A/D converter of FIG. 1. As before, like-references serve like-functions. Under practices taught in the prior art and illustrated in FIG. 1, primary resistor ladder 13 and secondary resistor ladder 18 were each coupled across reference potential levels +Vr and −Vr. Operating conditions and temperature variations could cause threshold levels to drift in primary resistor ladder 13 and in secondary resistor ladder 18. Typically, the drift within primary resistor ladder 13 would not be tracked by the drift within secondary resistive ladder 18. Further, operating conditions and temperature variations could cause changes in the operating characteristics of differential amplifier 16. Such variations in amplifier 16 would be independent of any drift within resistor ladders 13 and 18. Overall reliability and accuracy of the converter are reduced thereby.

In the innovative embodiment of FIG. 5 the reference voltage, +Vr1 to −Vr1, for secondary resistor ladder 18 is derived by amplifying in reference tracking amplifier 23 a threshold voltage step from primary reference ladder 13. For example reference tracking amplifier 23 might be utilized to amplify the voltage step used for encoding the least significant bit in primary reference ladder 13. Since the voltages Vr1 and −Vr1 are derived from a voltage step within primary resistor ladder 13, any drift experienced in primary resistor ladder 13 will cause a similar drift within secondary resistor ladder 18. Thus, both primary and secondary resistor ladders will track with variations in operating conditions and temperatures. Further, by utilizing monolithic, integrated circuit techniques to fabricate amplifiers 16 and 23, the reference voltages +Vr1 to −Vr1 applied across secondary resistor ladder 18 will tend to track the peak amplitude of the error signal output by amplifier 16 and applied to secondary comparator bank 17. Through tracking of threshold reference voltages and signal error voltages, the need to adjust and stabilize the resistive ladders and the gain of signal error amplifier 16 is eliminated.

Those skilled in the art will recognize that the improvement embodied within the converter of FIG. 5 may be utilized with the improved embodiment of FIG. 4 to achieve even greater performance, reliability, and accuracy in the operation of a multithreshold A/D converter.

Uni-Polarity Approach Reduces Thresholds By Fifty Percent

Figure 6:
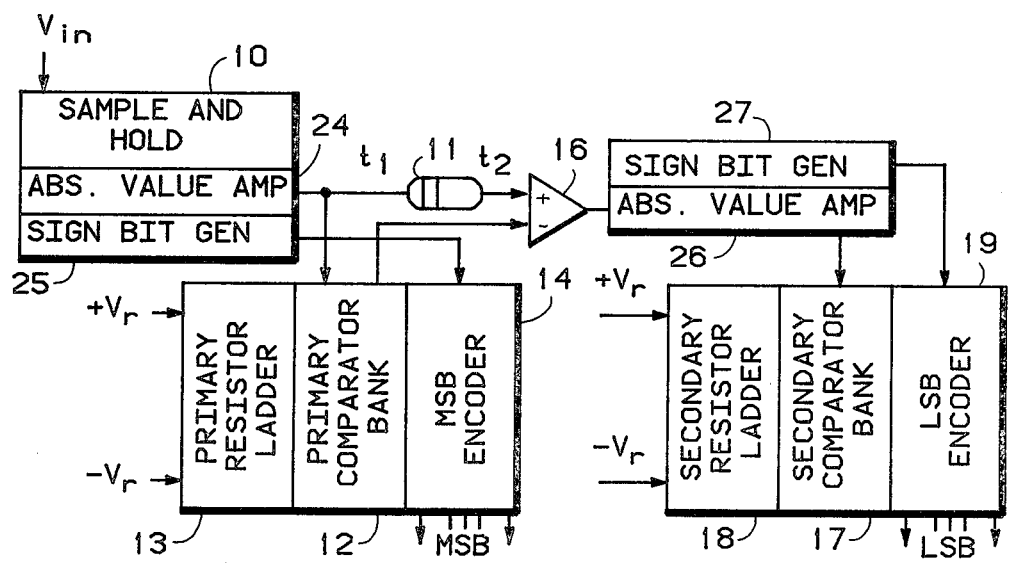
FIG. 6 illustrates an embodiment of the invention in which an absolute value device is utilized to fold the incoming signal about a selected threshold reference level so that only one polarity signal is presented to the threshold comparison stages for quantizing.

An additional improvement in the prior art embodiment of the multithreshold A/D converter of FIG. 1 is illustrated in the block diagram of FIG. 6. Both the input voltage Vin and the signal error voltage output from differential amplifier 16 are passed through absolute value amplifiers 24 and 27 prior to being coupled to their respective comparator banks 12 and 17 respectively. An absolute value amplifier is a unity gain transducer which outputs a signal of only one polarity regardless of the polarity variations experienced by the input signal.

As an example of the use of an absolute value amplifier in a multithreshold A/D converter assume that the input signal Vin passes through absolute value amplifier 24 after traversing sample and hold circuit 10. A unipolarity signal results which, by the design of absolute value amplifier 24, may be chosen to always lie above a selected threshold level of primary resistor ladder 13, for example, threshold level −Vx. In the prior art converter of FIG. 1 a comparator would be required for each quantization threshold step of input signal Vin falling below −Vx as well as a comparator for each quantization step in the level of Vin rising above −Vx. However, by utilizing absolute value amplifier 24 to fold the input signal Vin about reference level −Vx, a single comparator may be utilized for each instance where two had been required in the prior art. An incoming signal of magnitude +$V_K$ will pass through the same comparator regardless of its input polarity. All that is required is to provide a sign bit determination of whether input signal $V_K$ actually lies above or below the selected folding reference level −Vx. Sign bit generator 25 serves this function.

Since by use of absolute value amplifier 24 one comparator now serves the function formally performed by two comparators in the prior art converter, it is seen that the number of thresholds have been reduced by fifty percent, plus the sign bit comparator, for any given number of bits output by the converter. In other words, for an n bit converter utilizing an absolute value amplifier to fold the input signal Vin about a selected threshold reference level $-V_x$, the number of comparators required will be one-half of the quantity ($2^n$). A similar savings in threshold levels is made by the use of absolute value amplifier 26 at the secondary comparison level of the converter.

It will be recognized that the improvements suggested in FIGS. 4, 5 and 6 may be incorporated together, along with the innovative comparator of FIG. 3, in a single comparator to provide high speed, high reliability, high accuracy performance.

The Composite, Improved A/D Converter

The manner in which the various improvements, disclosed above, may all be incorporated in one greatly improved A/D converter will now be presented.

Figure 7:
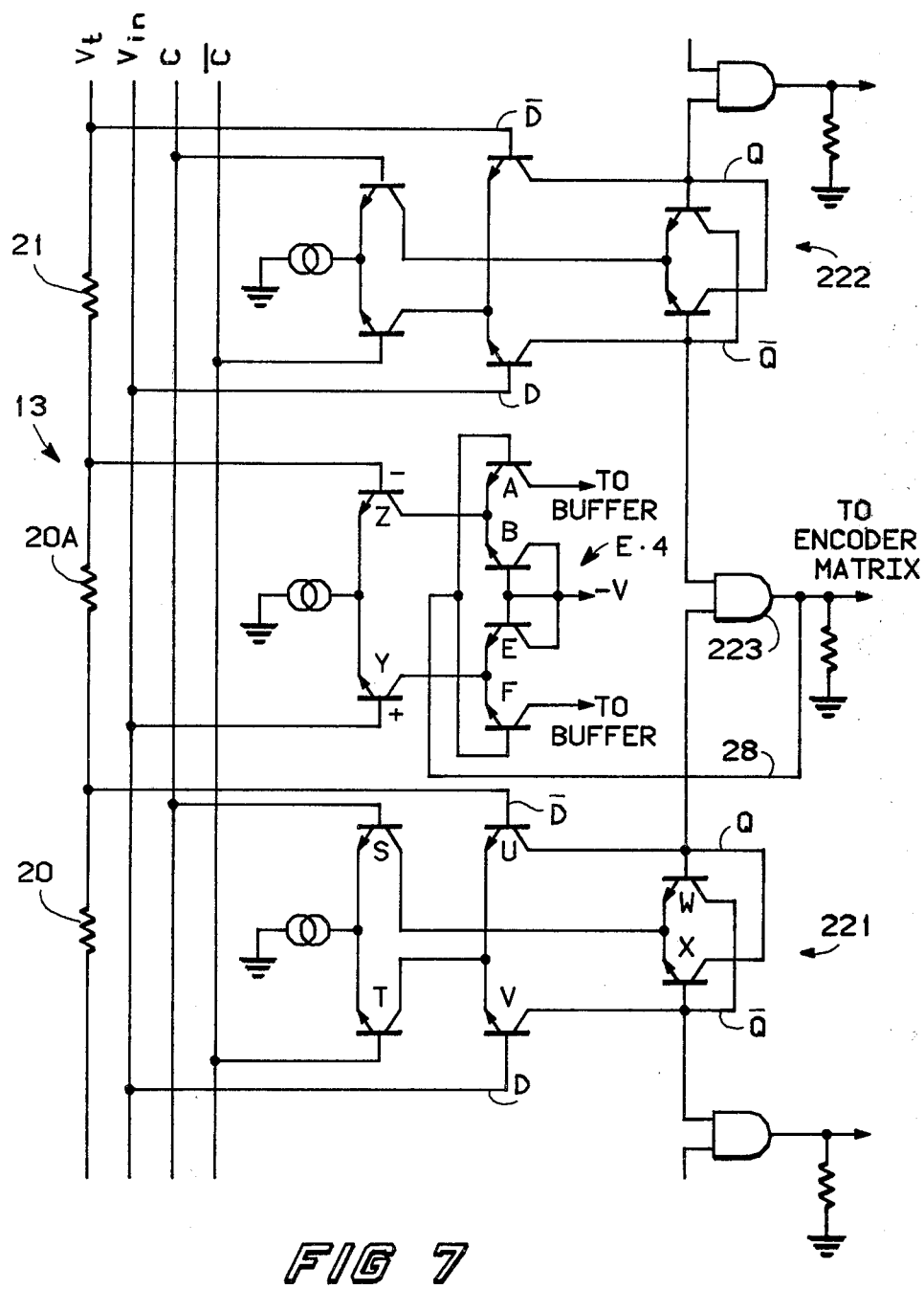
FIG. 7 is a schematic drawing of a multithreshold A/D converter showing a pair of the regenerative comparators disclosed herein as well as the use of error amplifiers at threshold reference points intermediate of the threshold points associated with the adjacent pair of comparators.

FIG. 7 is a schematic drawing of an improved A/D converter which includes two of the regenerative comparators 221 and 222 as were represented in block diagram form in FIG. 3. Comparator 221 is here chosen for exposition, it being understood that all comparators in the improved converter function as does comparator 221.

Comparator 221 is seen to be made up of a current control switch comprised of transistors S and T, a replication amplifier comprised of transistors U and V, and a regenerative logic level generator comprised of transistors W and X. In the embodiment of the invention reduced to practice, replica amplifier U-V was a limiting amplifier with a gain of approximately five which produced a non-linear replica of the D and $\overline{D}$ inputs, at the Q and $\overline{Q}$ outputs respectively, when clock signal $\overline{C}$ was high causing conduction of current switch transistor T.

With current switch transistor T conducting under a high $\overline{C}$ input, and assuming that the D input of replica amplifier U-V at the base of transistor V is high while the $\overline{D}$ input of transistor U is low, then transistor V will provide an easier conduction path for current than will transistor U. Thus, the $\overline{Q}$ output at the collector of transistor V will be lower than the Q output at the collector of transistor U.

It must be remembered here that, although Q may have a greater magnitude than $\overline{Q}$, their present magnitudes replicate the magnitudes of the input analog signals with respect to the threshold reference voltage. As non-logic signals, the differential between Q and $\overline{Q}$ may not represent a full logic swing. This would be especially true if the input Vin were at or close to the threshold level input at $\overline{D}$. To appreciate the improvement to be rendered by use of comparators such as 221 it should be remembered that, although the differential between Q and $\overline{Q}$ at this moment in time does not represent a full logic swing, that signal is presently available at Q and $\overline{Q}$ outputs for instant use.

When the status of the D and $\overline{D}$ signals is reversed from that of the example above the status of the Q and $\overline{Q}$ outputs are also reversed.

When $\overline{C}$ goes low and C goes high, transistor T of the current switch will be cut off and transistor S will go into conduction. This provides the current path to enable logic level generator W-X. Transistor W has its base connected to the Q output of comparator 221 while transistor X has its base connected to the $\overline{Q}$ output. The collector of each of the transistors is connected to the base of the other of the two. As is well known to those skilled in the art, this provides a positive feedback promoting the occurrence of a regenerative action.

With a clock pulse C of 1 ns and residual capacity on the order of 0.5 picofarads, logic level generator W-X is enabled by clock pulse C to react regeneratively upon the Q and $\overline{Q}$ signal replicas of the D and $\overline{D}$ inputs. This regenerative action causes the Q and $\overline{Q}$ differentials to rise to that of a full logic swing at the instant (consistent with the gain bandwidth product of W and X) that the clock rolls over from $\overline{C}$ high to C high.

This instantaneous response, due to the fact that the replica signal was there present at the time of clocking, is far better than that experienced with prior art comparators. Further, the comparator will not hang up when the input signal is extremely close to that of the reference threshold. An absolute indication will always be obtained, the fineness of the distinction being determined by the duration of the C pulse and the regeneration time of the pair X-W.

It may be seen that either the Q or $\overline{Q}$ outputs may be used in the manner of conventional comparators. For example, if the $\overline{Q}$ output of a plurality of comparators such as 221 is utilized in a multithreshold A/D converter, the $\overline{Q}$ outputs of comparators below the Vin threshold will all be low while those comparators above the Vin threshold will present a high logic level at their $\overline{Q}$ outputs.

In the discussion of FIG. 4 it was suggested that the basic multithreshold level A/D converter could be improved by interspersing signal error amplifiers among the comparators. In FIG. 7, one such error amplifier E-4 is indicated. Transistors Y and Z comprise a differential amplifier whose collector currents selectively conduct through transistors B and E to the $-V$ power source or through transistors A and F to buffer amplifier 161 not shown. Logic gate 223 connected between the Q output of comparator 221 and the $\overline{Q}$ output of comparator 222 provides the mechanism for determining the conduction path of the collector current flow of differential amplifier transistors Y and Z. Conductor 28 provides a conductive path between the output of logic gate 223 and the common base connection of transistors A and F. It will be noted that the base of transistor Z is connected to primary resistor ladder 13 at a point intermediate that at which comparators 221 and 222 have their $\overline{D}$ inputs connected. Transistor Y has its base connected to the input analog signal Vin.

Should a situation exist such as indicated in FIG. 3 wherein both inputs of logic gate 223 are at a logic high level, the output of gate 223 will go high and this high state will be conducted via conductor 28 to the bases of transistors A and F causing them to conduct and provide a current path through transistors Z and A and through transistors Y and F to buffer amplifier 161. A and F comprise common base amplifiers which act essentially as a transconductance amplifier to pass the collector current of transistors Z and Y to buffer amplifier 161 without change. This situation would prevail when the threshold voltage presented at the base of transistor Z is approximately equal to the analog signal Vin presented at the base of transistor Y.

In all other cases, one of the inputs to gate 223 will be low which will cause the output of gate 223 to be low as well. Circuitry details not indicated in FIG. 7 will drive the output of gate 223 approximately 0.2 volts more negative than that of the $-V$ supply to which base and collector of transistors B and E are connected. Thus, when the output of gate 223 is at a low logic level, this low level will be transferred via conductor 28 to the bases of transistors A and F, causing them to be cut off and allowing the collector currents of transistors Z and Y to pass through transistors B and E to the negative power supply of −V.

It is thus seen that no output from error amplifier E-4 is conveyed to buffer amplifier 161 except in that particular instance in which the output of gate 223 goes high. It should be realized that differential amplifier Y-Z is always conducting, either through transistors A and F to buffer amplifier 161 or through transistor B and E essentially to ground through the −V power source. Likewise, aS hereinbefore described, a full logic level signal is established at the Q and $\overline{Q}$ outputs of comparators 221 and 222 at the instant that clock signal C is applied. Thus, there is essentially no delay in gating the signal through error amplifier E-4 to buffer amplifier 161 when the C clock is applied. Since the output of the logic gates such as 223 is conveyed to an encoder matrix, this output also is readily available at the instant the C clock is applied.

A ten-bit multithreshold A/D converter is illustrated in the block diagram of FIG. 8. This converter is seen to be comprised of primary resistor ladder 13, a primary comparator bank 12, made up of the regenerative comparators described in FIG. 3 and FIG. 7, with error amplifiers E-0 through E-16 interspersed among the comparators of primary comparator bank 12.

Primary comparator bank 12 is comprised of comparators referenced M-1 through M-15, which are connected to logic gates MG-1 through MG-14 in the manner described with reference to FIG. 7 and gate 223. Error amplifiers E-2 through E-15 are gated-on by these logic gates in the manner disclosed in the discussion of FIG. 7. In the case of error amplifier 16, it will be gated on when, and only when, the Q output of comparator M-15 goes high.

The determination of which of amplifiers E-0 or E-1 shall be gated on is made by switch S-1, whose purpose shall be discussed in greater detail hereinafter. The encoder matrix 14 receives the output of logic gates MG-1 through MG-14 and of the Q output of comparator M-15. These fifteen inputs will be encoded by encoder matrix 14 into digital signals representative of the five most significant bits of the digital representation of the analog input signal. Switch S-1 also provides an input to encoder matrix 14 via conductive path 29. This input constitutes a sign bit which will be discussed further with the disclosure of switch S-1.

The output of a selected one of error amplifiers E-0 through E-16 is conveyed by error buffer amplifier 161 to the secondary stages of the A/D converter of FIG. 8.

The secondary stages of the A/D converter of FIG. 8 are comprised of secondary resistor ladder 18, secondary comparator bank 17, and LSB encoder matrix 19. As in the primary stages of the converter, secondary comparator bank 17 utilizes the regenerative comparators disclosed in the discussion of FIG. 3 and FIG. 7, and which are here labeled L-0 through L-15.

Logic gates LG-1 through LG-13 are utilized at the outputs of comparators L-2 through L-15 in the manner indicated in FIG. 7 so that the same encoding logic scheme utilized in the primary stages may also be used in the secondary stages. This logic scheme requires that all inputs to the logic matrix shall be at a low level except that there shall be one high level input at the threshold position most nearly coinciding with the magnitude of the analog input signal.

Comparators L-0 and L-1, as well as the $\overline{Q}$ output of comparator L-2 are fed through switch S-2 to LSB matrix encoder 19. Discussion of the function of switch S-2 will be postponed until later in the specification. The Q output of comparator L-15 is provided directly to an input of LSB matrix 19. The sixteenth input to encoder 19 is a sign bit input from conductor 31.

The 5-bit output of encoder matrix 19 provides the least significant bits of the digital representation of the analog input signal Vin. The outputs of encoder matrix 14 and encoder matrix 19 may be strobed into output register 32 to be made available to other, associated equipment not part of this disclosure.

The discussion accompanying FIG. 5 indicated that the incorporation of a reference tracking amplifier would permit secondary resistor bank ladder 18 to track any drift in primary resistor ladder 13. In FIG. 8 reference tracking amplifier 23 provides a differential amplification of the threshold voltage developed across resistor 33 of primary resistor ladder 13. The output of reference tracking amplifier 23 is fed through reference buffer amplifier 231 from whence it is applied across secondary resistor ladder 18. Thus, any drift in the primary resistive ladder 13 will be tracked within secondary resistor ladder 18.

An important feature of the converter provides that all interspersed error amplifiers E-0 through E-16, error buffer amplifier 161, reference tracking amplifier 23, and reference buffer amplifier 231 shall all be identically matched through use of monolithic, integrated circuit fabrication technology. Thus, all these various amplifiers will track in response to operating and environmental conditions imposed upon the converter. This has a further effect in that the error reference voltage of secondary resistive ladder 18 will also tend to track the peak amplitude of the error signal. This eliminates the need for adjustment and stabilization of amplifier gain and error reference voltage with changes in temperature and processing parameters.

In the discussion of FIG. 6 it was disclosed that the incorporation of an absolute value amplifier 24 at the input of the comparator resulted in a reduction by fifty percent of the number of threshold levels required for an n bit comparator. That is, instead of requiring $2^n-1$ threshold levels only $2(n-1)$ threshold levels are required for an n-bit comparator utilizing an absolute value amplifier at its input. The comparator of FIG. 8 has similarly been improved by the incorporation therein of absolute value amplifiers 24 and 26.

The functioning of an absolute value amplifier may be considered as a folding operation. Consider a sine wave which rises and falls an equal distance above and below a reference line. If all of the wave below the reference line is folded upward about that reference line, the presentation is similar to that of a full wave rectifier. The peaks of the fully rectified wave are smoothly rounded but at the points at which the wave touches the reference lines there is an abrupt transition having a characteristic V-shape.

Figure 9:
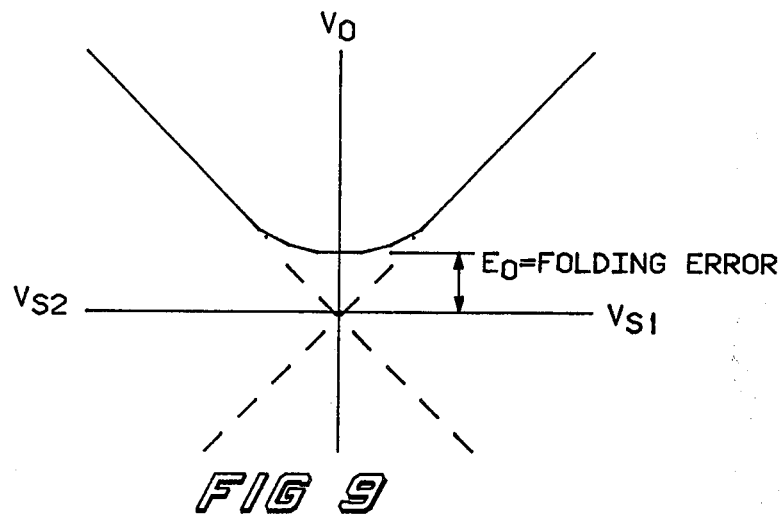
FIG. 9 is a graphic representation of the output characteristics of a typical absolute value amplifier.
Figure 10:
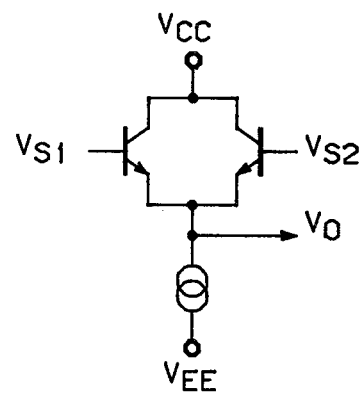
FIG. 10 is a schematic diagram of an absolute value amplifier utilized in the present embodiment and having the output characteristics illustrated in FIG. 9.

However, such a wave presentation is ideal and in actual practice an absolute value amplifier does not provide the sharp V-shaped transition in the vicinity of the reference line about which the wave is folded. Instead of a sharp V shape, a rounded cusp is formed and the wave actually never falls to the reference line as shown in FIG. 9. This failure of the signal to fall to the reference line about which the signal is folded is denoted as the folding error of the absolute value amplifier. The existence of this folding error must be taken in account if the inherent advantages of the absolute value amplifier are to be utilized. A simple absolute value amplifier, which may be used in this application to provide the advantages described, is illustrated in FIG. 10. The amplifier includes two N-P-N type transistors in an emitter coupled configuration. This absolute value amplifier, along with the other circuits described, are particularly suited to monolithic circuit fabrication since component matching (matched transistors) is used to achieve the folding characteristics. The error $E_o$ (FIG. 9) in the output voltage $V_o$ is the absolute value of $||V_{s1}|-V_o|$ with small error when $|V_{s1}-V_{s2}|$ is close to zero volts.

In the converter of FIG. 8, the analog input signal Vin is fed to sample and hold circuit 10, whose output is fed to amplifier 34 and inverter 35. The output signals thereof, Vin and $\overline{Vin}$, are fed to the inputs of absolute value amplifier 24, which outputs the absolute value of the analog signal Vin and presents it to comparators M-1 through M-15 for quantization.

The signals Vin and $\overline{Vin}$ are also fed respectively to the D and $\overline{D}$ inputs of sign bit generator 25 whose outputs Q and $\overline{Q}$ are fed to switch S-1.

The signals Vin and $\overline{Vin}$ are also fed to differential amplifiers E-0 and E-1 as shown in FIG. 8. The purpose of differential amplifiers E-0 and E-1 are to provide a differential output error signal to error buffer 161 when the input analog signal has a magnitude falling within the region of the folding error of absolute value amplifier 24.

When Vin is within the folding error region of absolute value amplifier 24, the $\overline{Q}$ output of comparator M-1 will be high. This high output at the $\overline{Q}$ of comparator M-1 activates switch S-1 permitting sign generator 25 to determine which of amplifiers, E-0 or E-1 shall be gated on. That amplifier is selected whose input analog signal is above the $-Vr$ refernce about which the input signal is folded by absolute value amplifier 24.

When the $\overline{Q}$ output of comparator M-1 is low, indicating that the analog signal is outside the range of the folding error of absolute value amplifier 24, switch S-1 is inhibited from gating on either amplifier E-0 or amplifier E-1.

In any event, a sign bit is output from switch S-1 on conductor 29 to MSB encoder matrix 14 to identify the input signal as being either positive or negative with respect to the reference $-Vr$ about which the input signal is folded.

Absolute value amplifier 26 is utilized in the secondary stages of the converter of FIG. 8. The error signal output of buffer 161 is fed to absolute value amplifier 26 and the absolute value of the output signal is then fed to comparators L-2 through L-15 for quantization.

Switch S-2 is utilized in a manner similar to switch S-1 in the primary stages of the converter. A high level at the $\overline{Q}$ output of comparator L-2 will activate switch S-2, while a low level at the $\overline{Q}$ output of L-2 will inhibit switch S-2. Sign bit generator 27 acts on the output of error buffer 161 to output a sign bit on its Q output on conductor 31. This sign bit is fed to switch S-2 to determine which of comparators L-0 or L-1 will be selected to output its signal through switch S-2 to LSB matrix encoder 19.

Comparators L-0 and L-1 are selected in accordance with whether the signal output of error buffer 161 is positive or negative with respect to the folding reference of absolute value amplifier 26 and, in any event, are utilized only when the error signal output of error buffer amplifier 161 is within the folding error region of absolute value amplifier 26.

The A/D converter of FIG. 8 thus incorporates all of the improvements disclosed in FIGS. 3 through 7 herein.

What is disclosed is a new, instantaneously reacting comparator comprised of a clocked, replica amplifier and a clocked, regenerative logic level generator which provides absolute differentiation of input analog signals and threshold reference signals which are extremely close in magnitude.

Further disclosed are the improvements resulting from the interspersing of error amplifiers among the comparators of a multithreshold A/D converter showing that the dynamic range requirements of an error amplifier may thereby be drastically reduced while the response time of the amplifier may be greatly increased. It is further indicated that the use of monolithic techniques will provide that all such interspersed amplifiers will be identically matched and will track each other under all conditions of operation and environment.

The use of a reference tracking amplifier is shown to provide the reference voltage for the secondary resistive ladder network will permit the secondary resistive ladder to track the drift of the primary resistive ladder when the input of said tracking reference amplifier is taken from at least one of the threshold levels of the primary resistive ladder.

In addition, the use of an absolute value amplifier at the input to a multithreshold A/D converter has been indicated to result in a fifty percent reduction in threshold levels and component count since only $2^{(n-1)}$ threshold levels are thus required for an n-bit converter.

Finally, significant details of a multithreshold A/D converter have been disclosed which utilizes each of these improvements to provide an A/D converter which provides a significant advance in the state of the art.

Those skilled in the art will conceive of various modifications to the embodiments of the invention disclosed herein. To the extent that such modifications fall within the spirit and scope of the invention it is intended that they shall fall within the protection provided by the claims appended hereto.

Having disclosed the invention in such clear and concise terms that those skilled in the art may easily and simply practice the teachings herein, that which is claimed is:

1. A multithreshold A/D converter having primary and secondary quantizing stages comprising:
   primary threshold voltage network means for providing primary threshold reference voltage levels;
   a plurality of primary comparators each coupled to a different primary voltage level of said primary threshold voltage network means for comparing a given analog input signal to the primary threshold reference voltage levels and supplying outputs encoded to provide digital signals representative of the most significant bits (MSB) of the digital equivalent of the analog input signal;
   secondary threshold voltge network means for providing secondary threshold reference voltage levels;
   reference tracking amplifier means coupled to said primary and secondary threshold voltage network means for amplifying at least one of the primary threshold reference voltage levels and applying the amplified voltage level across said secondary threshold voltage network whereby any drift in the primary reference voltage levels will be tracked by said secondary threshold voltage network;

a plurality of error amplifiers each coupled to a different primary threshold reference voltage level intermediate those primary threshold reference voltage levels utilized by adjacent pairs of said plurality of primary comparators, a selected one of said error amplifiers outputting a signal differential of said intermediate threshold reference voltage level and said given analog input signal;

a plurality of secondary comparators each coupled to a different secondary voltage level of said secondary threshold voltage network means and to said plurality of error amplifiers for comparing the signal differential from the selected error amplifier to the secondary threshold reference voltage levels and supplying outputs encoded to provide digital signals representative of the least significant bits (LSB) of the digital equivalent of the analog input signal; and said reference tracking amplifier means and said plurality of error amplifiers being matched by formation of monolithically fabricated integrated circuits whereby said reference tracking amplifier means and said plurality of error amplifiers are identical to each other and track under conditions imposed by operation and environment.

* * * * *